SHORT-CHANNEL FIELD-EFFECT TRANSISTOR HAVING AN IMPURITY GRADIENT IN THE CHANNEL INCREASING FROM A MIDPOINT TO EACH END

Filed April 25, 1966

INVENTOR
JOHN J. SO,

BY Roger S. Borovoy & Stuart Lubitz

ATTORNEYS

United States Patent Office 3,398,337

Patented Aug. 20, 1968

3,398,337

SHORT-CHANNEL FIELD-EFFECT TRANSISTOR HAVING AN IMPURITY GRADIENT IN THE CHANNEL INCREASING FROM A MIDPOINT TO EACH END

John J. So, 1934 Rock, Mountain View, Calif. 94040

Filed Apr. 25, 1966, Ser. No. 545,035
5 Claims. (Cl. 317—235)

ABSTRACT OF THE DISCLOSURE

A field-effect device having a low value of $R_{on}$ and having a very short channel formed in such a manner as to have a gradient of impurities least concentrated at about the center of the channel and increasing in concentration from the center to each end of the channel. The device has source and drain contacts at the respective ends of the channel.

Figure 1:
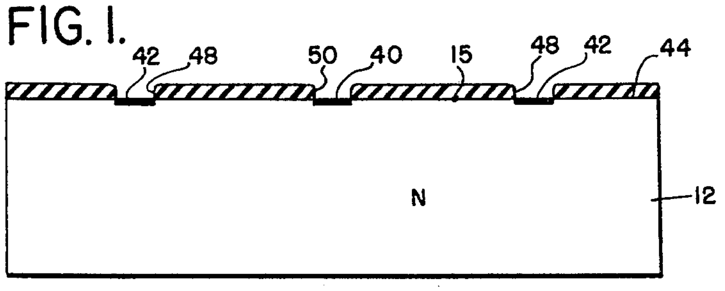
Figure 2:
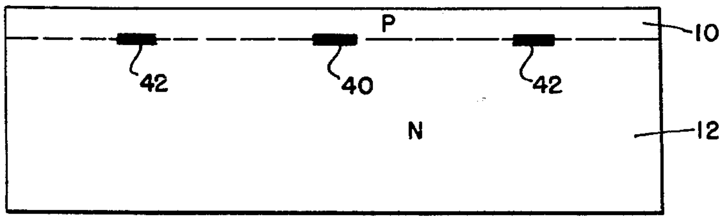

This invention relates to an improved field-effect transistor and a method for forming such a device. In particular, the invention provides a significant reduction of the "on" resistance (hereinafter referred to as $R_{on}$) and an increase in the cutoff frequency of a field-effect transistor, and it enables such device to be fabricated without critical masking steps.

Field-effect transistors were first described in the article, "A Uni-Polar Field-Effect Transistor," by Shockley, W., Proc. IRE, volume 40, pp. 1365–1376 (November 1950). Briefly, such prior art devices comprise a channel region having a gate intermediate to a source and a drain located at the extremities of the channel. The channel is a monocrystalline semiconductor region having a first conductivity type and located in a monocrystalline semiconductor body with its axis being substantially parallel to the surface of the monocrystalline semiconductor body. The gate is a monocrystalline semiconductor region having a conductivity type opposite the channel so that a p-n junction is formed with the channel intermediate to the source and drain. The reverse biasing of the p-n junction gate causes a depletion region to form which changes the conductance of the channel and, consequently, affects the amount of current passing from the source to the drain. When the gate is sufficiently reverse biased, the channel is pinched off and current essentially ceases. The voltage applied to the gate during this condition is in general referred to as the pinch-off or cutoff voltage of the device.

In the prior art field-effect transistors, such as described above, the $R_{on}$ would typically have a value of several hundred ohms. Such values for $R_{on}$ are undesirable when the field-effect transistor is used as a switching element. The length of the channel (e.g., about 10 microns) and, consequently, the value of the $R_{on}$ cannot be significantly reduced because of the structure of the conventional field-effect transistor and because of the photomasking techniques employed to produce such structure. The size of the gate and, consequently, the length of the channel is limited by present photoengraving techniques and the requirement that an electrical connection be made to the gate with the surface for receiving the connection thereto being substantially parallel to the length of the channel. Each reduction of the gate size adds to the cost and criticality of the photoengraving process. In addition, following the photoengraving (and masking) incident to the forming of the gate, it is often necessary to perform a further photoengraving and diffusion (including additional masking) steps to provide a source and drain to which ohmic contacts may be attached. The further photoengraving steps require precise alignment and accuracy in order to properly form and locate the source and drain with respect to the channel.

This invention provides a field-effect transistor with an $R_{on}$ which may be 10 to 20 times smaller than that achievable in present structures and a frequency cutoff which may be 10 to 20 times higher than such structures. This is accomplished by simplified and non-critical processing. More specifically, the invented field-effect transistor comprises a monocrystalline semiconductor region of a first conductivity type and having first and second surfaces; a monocrystalline semiconductor channel formed in said region of a conductivity type opposite to said region, said channel oriented to enable current to flow therethrough from said first surface to said second surface; and, a means for making source and drain contact to opposite ends of said channel. The invented method comprises forming a first-defined region of dopant on a substrate, depositing a monocrystalline semiconductor layer on said substrate over said refined region of dopant, forming a second-defined region of dopant on said monocrystalline semiconductor layer opposite said first-defined region, and diffusing the dopants of said first and second-defined regions into said layer so that they meet and form a channel for the field-effect transistor, wherein the resistivity of the channel is at least in part controlled by the thickness of the monocrystalline layer.

The above-described invention along with its advantages is described in detail hereinafter with reference to the drawing, wherein:

FIGS. 1–4 show the invented field-effect transistor in various stages of processing.

The field-effect transistor will first be described with reference to FIG. 4, followed by a description of the method with reference to FIGS. 1–4. Referring to FIG. 4, the field-effect transistor comprises a monocrystalline semiconductor body or region 10 having a first conductivity type (e.g., p-type) in the form of a very thin (for example, less than 10 microns) deposited layer. The region 10 is formed on a substrate 12 which may be a wafer of monocrystalline silicon having a conductivity type (e.g., n-type) opposite to that of region 10. The region 10 contains a plurality of monocrystalline regions 14 and 16 having a conductivity type opposite to that of region 10 and the same as substrate 12. Both of the regions 14 and 16 extend from surfaces 13 and 15 of region 10 and have a restricted or a truncated figure-eight configuration with a very narrow portion or throat 18. The region 16 has a closed path geometry which may take the form of a circle, square, rectangle or other shape which surrounds region 14.

The throat 18 of region 14 functions as a channel of a very short length with its main axis 24 oriented so that current flows from surface area 20 to surface area 22 or vice versa. Specifically, the axis 24 is substantially perpendicular to surface areas 20 and 22. The magnitude of the length of the channel formed by region 14 may be appreciated by recognizing that region 10 may have a thickness of as little as 1 micron or less. The channel formed by region 14 has a length in some instances smaller than the thickness of region 10 by an order of magnitude. Typically, region 14 forms a channel having a length of less than 5 microns. Channel lengths of 3 microns have been formed. The regions 14 and 16 may be formed by photoengraving and diffusion techniques which will be explained later in specification. When so fabricated, regions 14 and 16 include defined areas 20 and 22 having relatively high-surface concentrations of impurity. This facilitates the attaching of ohmic contacts thereto.

The gate for the invented FET is formed by the portion 30 of monocrystalline region 10 which surrounds region 14 and has contact 32 connected ohmically thereto. Contact 32 is constructed from an electrically conductive material (e.g., aluminum). The gate 30, 32 and region 14 form a p-n junction 34.

The structure of the field-effect device is completed by attaching appropriate contacts to the other regions of the device. Specifically, a contact 26 in the form of a metal conductive layer (e.g., aluminum) is ohmically connected to substrate 12 which functions as the source. The substrate 12 and region 14 being the same conductivity type provide a continuous conductive path from contact 26 to surface 13 and a contact 28. The contact 28 which is a layer of electrically conductive material (e.g., aluminum) is ohmically connected to surface area 22 of region 14 and functions as the drain. A passivating layer 36 (e.g., silicon dioxide, glass, etc.) protects surface 13 from contamination.

In operation, the application of a potential to contact 26 which is negative with respect to contact 28 will result in a current flowing from the source to the drain. This current may be controlled or switched on and off by the application of a potential to gate 30, 32 which reverse biases junction 34. The reverse biasing of junction 34 causes the depletion region to increase in width which lowers the conductance of throat 18 and the channel formed thereby, thus reducing the current that flows from contact 26 to contact 28. As the potential applied to gate 30, 32 is increased (that is, made more negative), the channel will pinch off and current flow from contact 26 to 28 will substantially cease.

The region 16 formed simultaneously with region 14 functions as an isolating region which separates the field-effect transistor from other devices that may be formed in region 10, thus device isolation is accomplished with no additional or separate diffusion steps. Another advantage of the invented device is that in the case of an integrated circuit (i.e., where there are a number of FET's or other devices formed in region 10), a cascade circuit may be readily formed. In such a circuit, substrate 12 would function as the common source for all of the cascaded devices, thereby facilitating interconnection.

With the structure of the invented field-effect transistor in mind, the method for fabricating such a device as well as other devices will now be described with reference to FIGS. 1–4. Referring to FIG. 1, the first step in the invented process is the forming of first-defined regions of dopant 40 and 42 on substrate 12. This may be accomplished by forming an oxide mask 44 on surface 15. In the case where substrate 12 is monocrystalline silicon, the mask 44 may readily be formed by placing substrate 12 in an oxidizing atmosphere, whereby a layer of silicon dioxide is grown on surface 15. Then, by well-known photoengraving techniques, openings 48 and 50 are formed. The forming of a mask by this procedure is well known in the art as described in U.S. Patent No. 3,025,389, issued on Mar. 20, 1962, to J. A. Hoerni. With the oxide mask 44 formed, the desired dopant (e.g., phosphorus) is deposited on the exposed surface areas 20. The term "deposition" or "deposit" as used in this specification is intended to include at least liquid, vapor and vacuum deposition as well as chemical growth processes. Any excess deposited material may be selectively removed by etching, lifting or other well-known techniques. The temperature and time for the deposition of the dopant may be such that there is some diffusion of the dopant into substrate 12. The depositing of dopant is considered in such U.S. patents as No. 3,419,395, issued on Sept. 22, 1964, to A. R. Bray et al., and No. 3,089,794, issued on May 14, 1953, to J. C. Marinace.

With the defined regions of dopant formed on or in substrate 12, a monocrystalline region is formed on surface 15 of substrate 12 and the first-defined dopant regions 40 and 42. To accomplish this, the mask 44 is first stripped from surface 15. The surface 15 is then cleaned and polished as may be appropriate and a monocrystalline region 10 is deposited on surface 15 by well-known deposition techniques, such as by epitaxial growth which is described in the previously-mentioned U.S. patents to Bray et al. and Marinace.

Figure 3:
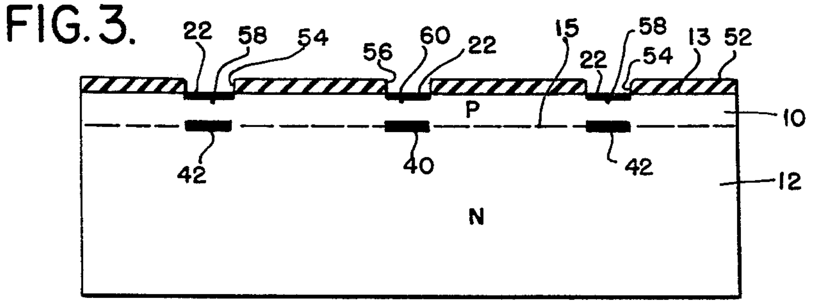
Figure 4:
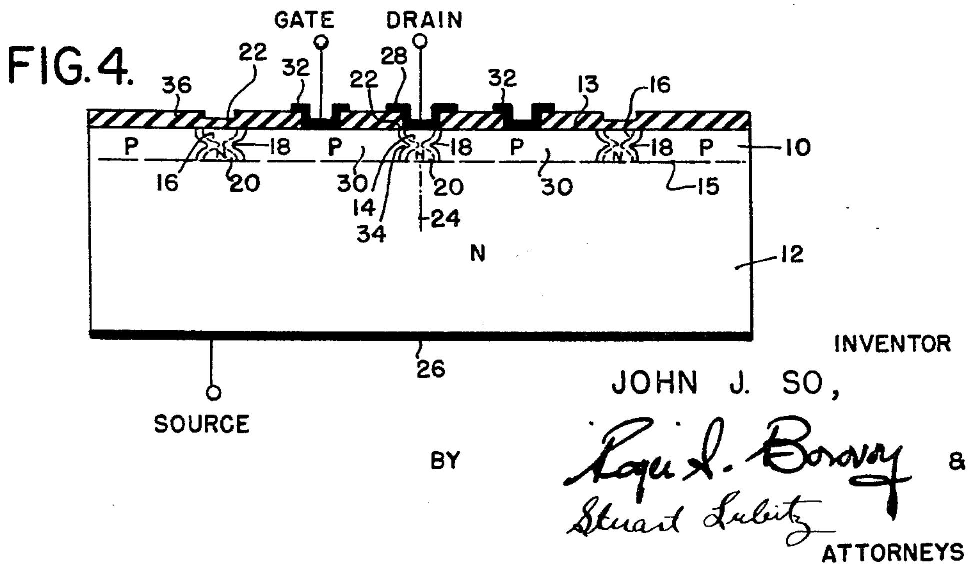

Referring to FIG. 3, the step of forming a defined region of dopant as explained above in connection with FIG. 1 is repeated so that second-defined regions 58 and 60 of dopant are formed on surface 13 of monocrystalline region 10. Briefly, this is done by growing an oxide layer 52, photoengraving the oxide mask to form openings 54 and 56 and depositing dopants on the surface areas 22, whereby dopant regions 58 and 60 are formed. The same processing mask used to form oxide mask 44 is employed to form mask 52. The processing mask is aligned with respect to substrate 12 so that dopant regions 58 and 60 are aligned and opposite to dopant regions 42 and 40, respectively. The oxide mask 52 remains on surface 13 and forms a part of passivating layer 36 which protects the devices formed in region 10.

The semiconductor portion of the device is completed by diffusing the dopants of regions 40 and 42 and regions 58 and 60 so that they meet and form the channel, gate and isolation region of the field-effect transistor. Various diffusion processes are described in all of the above-mentioned patents.

The diffusion may be carried out in an oxidizing atmosphere whereby passivating layer 36 is completed. Alternatively, passivating layer 36 may be completed by a later processing step. Thus, one diffusion results in the formation of substantially all of the semiconductor elements of the device. This saves a considerable amount of processing time. In addition, the same processing mask is employed to form masks 44 and 52, thus simplifying the photoengraving equipment necessary.

The field-effect transistor is completed by forming ohmic electrical contacts 26, 28 and 32 with substrate 12, region 14 and portion 30, respectively. This may be accomplished by well-known photoengraving and metalizing techniques such as described in U.S. Patent No. 2,981,877, issued on Apr. 25, 1961, to R. N. Noyce.

In summary, the invented method and device provide the following advantages:

(1) An extremely low $R_{on}$ (e.g., 5–10 ohms);
(2) High frequency of operation capability due to short-channel transit time (e.g., 10–20 times higher than present structures);
(3) Large transconductance and high output power as a result of connecting more than one channel in parallel;
(4) Simple fabrication requiring only one mask;
(5) Gate isolation with no additional or separate diffusion steps;
(6) Very low gate-to-ground capacitance;
(7) A minimum gate-to-drain capacitance;
(8) A device readily integratable to form a cascaded FET circuit; and,
(9) Fewer fabrication steps.

Although this invention has been disclosed and illustrated with reference to particular applications, the principles involved are susceptible of numerous other applications which will be apparent to persons skilled in the art. The invention is, therefore, to be limited only as indicated by the scope of the appended claims.

What is claimed is:

1. In a semiconductor field-effort transistor having a low value of $R_{on}$, the combination comprising:
   - a substrate of semiconductor material of a first conductivity type;
   - a monocrystalline semiconductor region of opposite conductivity type, on said substrate of first conductivity type and having first and second surfaces;
   - a monocrystalline semiconductor channel of said first conductivity type, in said opposite conductivity type region said channel oriented to enable current to flow therethrough from said first surface to said second surface, and having two adjacent parts with a restricted configuration therebetween, each end of said channel being contiguous to a respective one of said surfaces, the concentration of first conductivity-type-inducing impurities in both parts of said channel increasing along the direction of said current flow from said restricted configuration towards said ends; and a source contact electrically connected to one end of said channel and a drain contact electrically connected to the other end of said channel.

2. The structure recited in claim 1, wherein said channel has its main axis located substantially perpendicular to said first and second surfaces.

3. The structure recited in claim 1 including a gate bias means coupled to said monocrystalline region for at least in part controlling the depletion region associated with said channel.

4. The structure recited in claim 1, wherein said monocrystalline region comprises epitaxial material.

5. The structure recited in claim 4, wherein said one of said source and drain contacts is coupled to said substrate and a gate means is coupled to said epitaxial layer.

References Cited

UNITED STATES PATENTS

| | | | |
|---|---|---|---|
| 2,987,659 | 6/1961 | Tenzer | 317—235 |
| 3,126,505 | 3/1964 | Shockley | 317—235 |
| 3,171,042 | 2/1965 | Mataré | 307—88.5 |

JOHN W. HUCKERT, *Primary Examiner.*

M. H. EDLOW, *Assistant Examiner.*

UNITED STATES PATENT OFFICE
CERTIFICATE OF CORRECTION

Patent No. 3,398,337 August 20, 1968

John J. So

It is certified that error appears in the above identified patent and that said Letters Patent are hereby corrected as shown below:

In the heading to the printed specification, line 6, "1934 Rock, Mountain View, Calif. 94040" should read -- Mountain View, Calif., assignor to Fairchild Camera and Instrument Corporation, Syosset, Long Island, N. Y., a corporation of Delaware --.

Signed and sealed this 3rd day of March 1970.

(SEAL)
Attest:

Edward M. Fletcher, Jr.
Attesting Officer

WILLIAM E. SCHUYLER, JR.
Commissioner of Patents